United States Patent [19]

Antreasyan et al.

[11] Patent Number: 5,305,340
[45] Date of Patent: Apr. 19, 1994

[54] WAVEGUIDE RIDGE LASER DEVICE WITH IMPROVED MOUNTING AND RIDGE PROTECTION

[75] Inventors: Arsam Antreasyan; Myra N. Boenke, both of Hopewell Junction, N.Y.; Greg Costrini, Austin, Tex.; Kurt R. Grebe, Beacon, N.Y.; Christoph Harder, Zurich, Switzerland; Peter D. Hoh, Hopewell Junction, N.Y.

[73] Assignee: International Business Machines Corporation, Armonk, N.Y.

[21] Appl. No.: 991,009

[22] Filed: Dec. 16, 1992

[51] Int. Cl.$^5$ ................................ H01S 3/18
[52] U.S. Cl. ........................ 372/43; 372/45; 372/46
[58] Field of Search ........................ 372/45, 46, 43

[56] References Cited

U.S. PATENT DOCUMENTS

| | | | |
|---|---|---|---|
| 4,377,865 | 3/1983 | Sugino et al. | 372/45 |
| 4,424,527 | 1/1984 | Rao et al. | 357/71 |
| 4,468,850 | 9/1984 | Liau et al. | 29/569 |
| 4,605,942 | 8/1986 | Camlibel et al. | 357/17 |
| 4,615,032 | 9/1986 | Holbrook et al. | 372/45 |
| 4,737,237 | 4/1988 | Chaminant et al. | 156/649 |
| 4,754,459 | 6/1988 | Westbrook | 372/32 |
| 4,783,788 | 11/1988 | Gordon | 372/45 |
| 4,792,959 | 12/1988 | Mueller et al. | 372/46 |
| 4,805,184 | 2/1989 | Fiddyment et al. | 372/96 |
| 4,851,368 | 7/1989 | Behfar-Rad et al. | 437/129 |
| 4,903,275 | 2/1990 | Ettenberg et al. | 372/50 |
| 5,042,045 | 8/1991 | Sato | 372/46 |
| 5,052,005 | 9/1991 | Tanaka et al. | 372/36 |
| 5,059,552 | 10/1991 | Harder et al. | 437/129 |
| 5,084,893 | 1/1992 | Sekii et al. | 372/46 |
| 5,099,488 | 3/1992 | Ahrabi et al. | 372/361 |
| 5,144,634 | 9/1992 | Gasser | 372/49 |

FOREIGN PATENT DOCUMENTS 3-183178 12/1989 Japan .

OTHER PUBLICATIONS

IEEE Proceedings, vol. 137, No. 5, Oct. 1990, R. Ash et al., pp. 315-317, "High Speed, self-aligned, 1300 nm buried ridge laser suitable for integration".

IEEE Photonics Technology Letters, vol. 2, No. 10, Oct. 1990, M. Jost et al., pp. 697-698, "Ridge formation for AlGaAs GRINSCH Lasers by Cl$_2$ Reactive Ion Etching".

Primary Examiner—Frank Gonzalez
Attorney, Agent, or Firm—Perman & Green

[57] ABSTRACT

A protection configuration for a semiconductor ridge waveguide laser structure is disclosed wherein layers of protective metal in the form of walls, is applied on each side of the ridge element of the ridged layer of the laser structure. The laser structure is then bonded to a mounting plate in a junction side down orientation by solder or a junction side up orientation by wire bonding. The metal layer may be composed of gold.

4 Claims, 2 Drawing Sheets

WAVEGUIDE RIDGE LASER DEVICE WITH IMPROVED MOUNTING AND RIDGE PROTECTION

FIELD OF THE INVENTION

The present invention relates to semiconductor ridge waveguide lasers, and more particularly to a ridge waveguide laser structure wherein the ridge element is protected by mounting and coating configurations.

BACKGROUND OF THE INVENTION

The present invention constitutes an improvement in optical devices known in the art as semiconductor ridge waveguide lasers. The basic ridge laser is described in the publication "High yield manufactures of very low threshold, high reliability, 1.3 um varied heterostructure laser diodes grown by metal organic chemical vapor deposition", by "Krakowski M., Blondeau, R., Kazmierski, K., Razeghi, M., Ricciardi, J., Hirtz, P., and DeCremoux, B.,: IEEE J. Lightwave Technol, 1986, LT-4, pp. 1470–1474. and by Jung, H. and Schlosser, E.: "InP/InGaAsP buried mesa ridge laser; A new laser with reduced leakage currents", Appl. Phys. Lett., 1989, 54, pp. 2171–2173.

A typical known ridge waveguide configuration is illustrated in FIG. 1 which is a perspective view wherein only the major elements of the device are shown. The layered structure, grown on a substrate 10, includes at least the active layer 12, sandwiched between cladding layers 14 and 16. The waveguide ridge 18 includes a contact layer 20 and the ridge part 16a of the upper cladding layer 16. Not shown in the drawing are the insulation embedding the sidewalls of the ridge and covering the surface of the upper cladding layer 16, and the metallization layers providing for the electrical contacts to the completed device.

When the device of FIG. 1 is activated by applying proper operating voltages, a light beam 22 is emitted. In the drawing, the light mode region of the laser is shown as a small ellipse centering around the active layer 12 and laterally defined by the stripe ridge 18.

Typical material for the waveguide ridge laser shown in FIG. 1 are N-InP for substrate 10, N-InP for the cladding layer 14, a GaInAsP active layer 12, a P-InP upper cladding layer 16, and a contact layer 20 composed of GaInAs.

The activation of the waveguide ridge laser, whereby electrical current flowing from the ridge part 16a to the substrate 10 through the waveguide layer 12, excites optical radiation 17 which is emitted.

SUMMARY OF THE INVENTION

Typical InP 1300 nm waveguide ridge lasers for data and telecommunication applications suffer from a limited temperature range of operations, having maximum operating temperatures of 80° C. to 100° C. which degrades the device operating performance. Normally ridge lasers are mounted with their substrates bonded to the mounting surface such that the junction side is above the substrate and the mounting surface. It has been found that a "junction side down" mounting of a 1300 nm ridge laser reduces the heating associated with the laser and thus permits lower operating temperatures and consequently higher performance for the device.

A drawback of the junction side down mounting technique is that the soldering process between the junction and the mounting surface often causes mechanical damage to the ridge and may result in solder covering the laser facet.

An object of the present invention is to provide an improved mounting configuration for ridge lasers.

Another object of the present invention is to provide an improved mounting configuration for junction side down mounting of the laser.

A further object of the present invention is to provide an improved mounting configurations for ridge lasers including a protective layer of selected material disposed above the waveguide layer of the laser.

DESCRIPTION OF THE PREFERRED EMBODIMENT

The invention utilizes metal walls disposed on and in combination with a 1300 nm InP ridge laser to be mounted in either a junction side down or a junction side up configuration. The invention resolves yield and reliability problems inherent in prior art ridge waveguide lasers. Junction side down mounting improves the thermal and operating performance of the laser and the metal walls prevents damage to the ridge and junction whether the laser is mounted with the junction up or down.

Typical InP 1300 nm lasers for data and telecommunication applications suffer from a limited temperature range of operation, having maximum operating temperatures of 80° C. to 100° C. Junction side down mounting improves the thermal performance and thus the operating range of these devices. Current techniques for junction side down mounting alone, however, results in lower device yield and reliability due to the close proximity of the laser active region to the solder contact. Ridge devices are especially prone to damage when mounted in a junction side down configuration. The present invention utilizes protective metal walls to overcome the problems associated with the junction side down mounting of a ridge laser. The protective walls also serve to protect the laser during manufacturing and when the laser is mounted junction side up.

Figure 1:
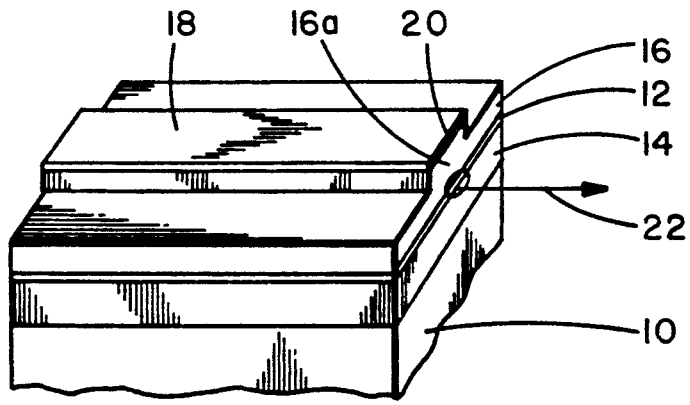
FIG. 1 is a perspective view of a waveguide ridge laser according to the prior art.
Figure 2:
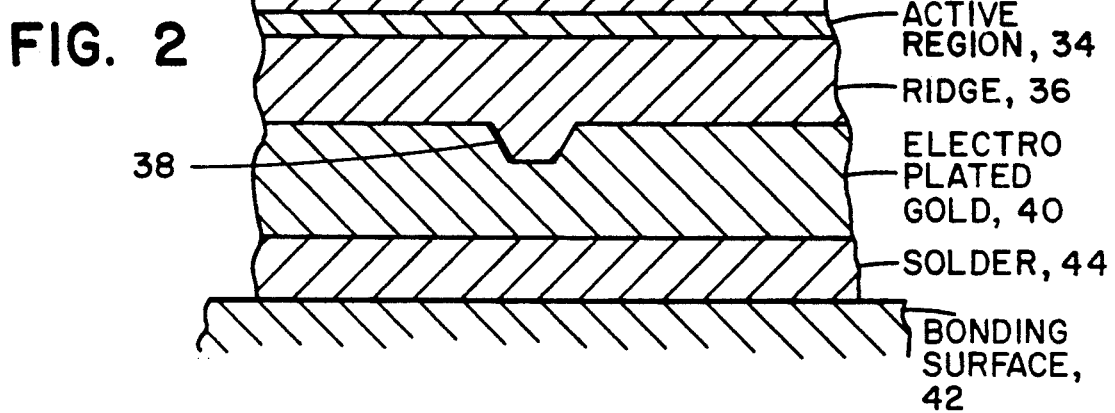
FIG. 2 is a schematic cross-section view illustrating a ridge laser protected by a layer of metal and mounted junction sidedown.

Referring to FIG. 2, a junction side down ridge laser structure is illustrated including an InP substrate 30, a cladding layer 32, an active region layer 34, a second cladding layer 36 including a ridge part 38.

In FIG. 2, multiple layers 40 of protective material, specifically gold, are disposed on the surface of the layer 36 and the aforesaid structure is then bonded to a mounting surface 42 by solder layer 44.

The fabrication steps for forming the structural configuration of FIG. 2 include the following steps:

Step 1. Disposing a layers of metal on the upper surface of the ridged layer of a semiconductor ridge waveguide laser structure.

Step 2. Bonding said multi layer metal to a mounting surface by solder.

The configuration illustrated in FIG. 2 provides sufficient clearance between the laser chip and the submount to prevent solder from coating the laser facet thereby degrading optical output and device lifetime. Also, the laser ridge is protected from mechanical damage and, provides for a stable optical alignment of the non-planar chip surface of the chip to the submount.

By placing thick layers of electroplated gold directly on the laser ridge, high yield junction side down mounting is achieved. The gold acts as both mechanical cushion from the stresses of the soldering process, and acts as a stand-off to keep solder away from the laser facet. Making the gold layer greater than 4 um thick satisfies the criteria for high yield junction side down mounting.

Figure 4:
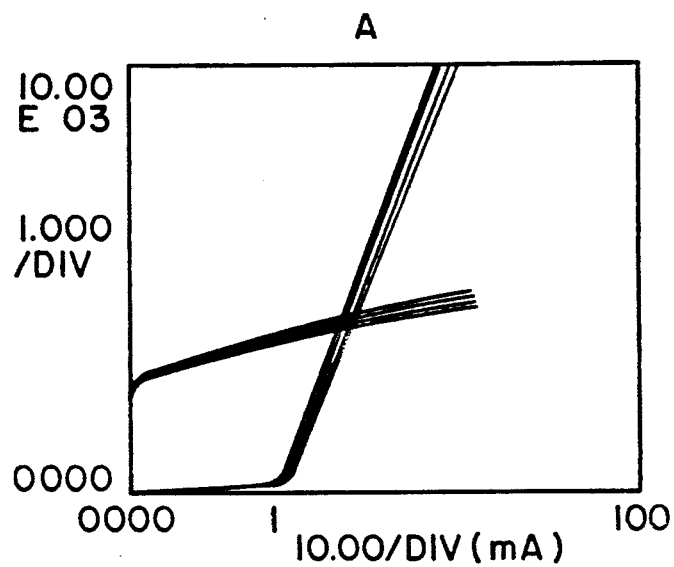
FIGS. 4 and 5 are curves which are used to illustrate the operation of the ridge laser of the present invention.
Figure 5:
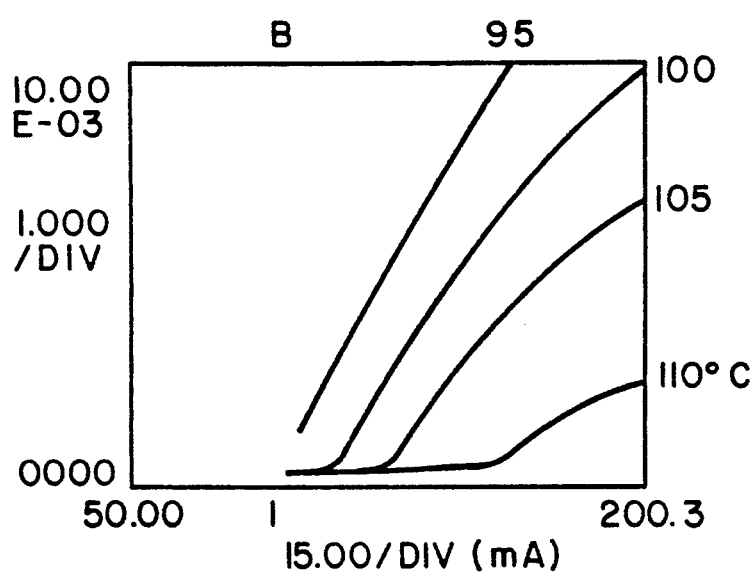

The single laser structure illustrated in FIG. 2 was incorporated into a quadruple array. FIG. 4 illustrates the power-current curves for the four lasers, and FIG. 5 shows the curves for high temperature operation at four separate temperatures.

Figure 3:
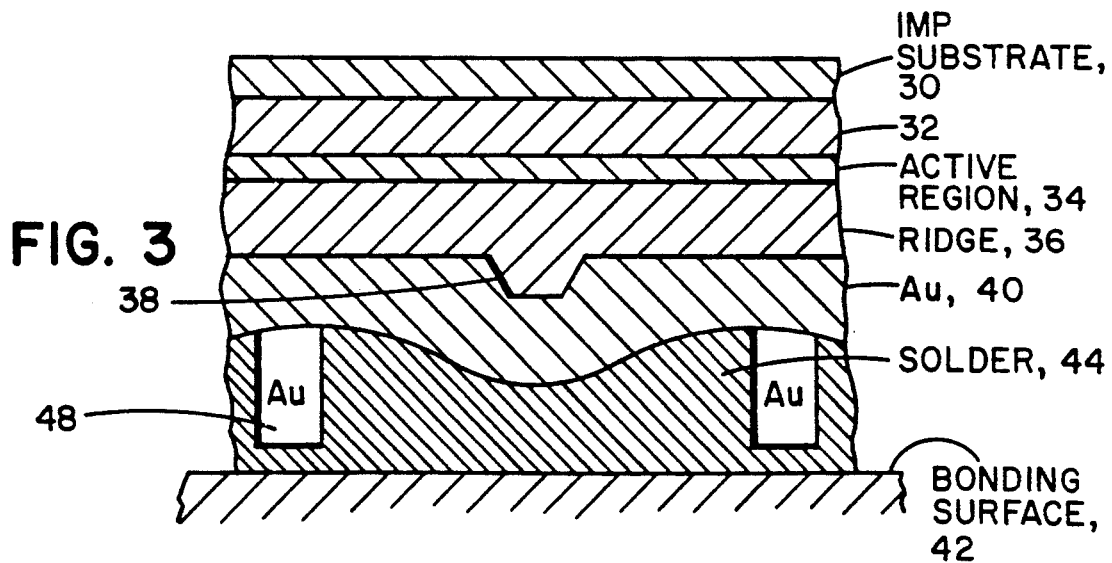
FIG. 3 is a schematic cross-section view of an embodiment of a ridge laser having protective walls of metal following the principles of the present invention.

Referring to FIG. 3, an embodiment of the present invention is illustrated in addition to the usual metalurgy typical in a ridge laser structure. A further metal such as gold is electroplated to form a "wall" 48 for protection around the laser ridge. Wall 48 extends higher from the surface of layer 36 than ridge 38 so as to further prevent damage to the ridge 48.

The structure shown in FIG. 3 wherein protective walls are formed on either side of the fragile ridge element is desirable whether the laser device is mounted in a junction side up or a junction side down configuration. The protective walls 48 serve to protect the fragile crystal element of the laser even during handling prior to mounting. The lasers are usually moved or carried by tools such as tweezers. The protective walls 48 bar any mechanical invasion in the area of the ridge which would produce damage.

The configuration of the laser illustrated in FIG. 3 depicts the laser being mounted in a junction side down manner. In such embodiment the walls 48 prevent the bonding procedures such as soldering from damaging the ridge element. Another advantage provided by the walls 48 in the junction side down mounting case is that a channel is formed between the walls that permits the solder to flow. This serves to eliminate the air voids which form with prior art structures.

The laser structure of FIG. 3 including substrate 30, layers 32, 34, 36, ridge 38, metalization 40 and walls 48 may also be mounted junction side up to a mounting plate by wire bonding techniques instead of solder. In the junction side up mounting the walls 48 also effectively function to protect the ridge element 38.

What has been described is an improved waveguide ridge laser structure combined with a ridge protective means in the form of walls of suitable metal such as gold on each side of the laser ridge element.

We claim:

1. A semiconductor ridge waveguide laser structure of the type including a semiconductor substrate, an active region layer disposed on said substrate, a ridged layer having at least one ridge part disposed on said active region layer and a layer of metalization on said ridged layer, characterized in having, a layer of protective metal disposed on said layer of metalization on each side of said ridge part of said ridged layer of said ridge waveguide laser structure to form a pair of protective walls, said protective walls having a height greater than said ridge part of said ridged layer.

2. A semiconductor ridge waveguide laser structure according to claim 1 wherein said protective metal forming said pair of protective walls is gold.

3. A semiconductor waveguide laser structure according to claim 1 further including a mounting member having a surface proximate to said metalized ridged layer and said protective walls for supporting laser structure, and a layer of solder disposed between said metalization layer, said protective walls and said mounting member to affix said waveguide ridge laser structure to said surface of said mounting member in a junction side down configuration.

4. A semiconductor waveguide structure according to claim 3 wherein areas between said protective metal walls on said ridged layer in combination with said surface of said mounting member forms a channel for containing said layer of solder.

* * * * *